United States Patent [19]
Horiuchi

[11] Patent Number: 4,564,942
[45] Date of Patent: Jan. 14, 1986

[54] TROUBLE SHOOTING SYSTEM FOR ELECTRIC VEHICLE

[75] Inventor: Michimasa Horiuchi, Katsuta, Japan
[73] Assignee: Hitachi, Ltd., Tokyo, Japan
[21] Appl. No.: 476,267
[22] Filed: Mar. 17, 1983
[30] Foreign Application Priority Data Mar. 19, 1982 [JP] Japan .................................. 57-42665

[51] Int. Cl.⁴ ............................................ G06F 11/22
[52] U.S. Cl. ......................................... 371/20; 371/15
[58] Field of Search ...................... 371/15, 20, 16, 17, 371/18, 19; 364/483, 424, 481

[56] References Cited

U.S. PATENT DOCUMENTS

| | | | |
|---|---|---|---|
| Re. 31,582 | 5/1984 | Hosaka et al. | 371/20 |
| 4,245,309 | 1/1981 | Kiefer | 371/20 |
| 4,275,464 | 6/1981 | Schmidt | 371/20 |
| 4,333,149 | 6/1982 | Taylor | 364/481 |
| 4,394,741 | 7/1983 | Lowndes | 364/483 |
| 4,412,328 | 10/1983 | Homa | 371/15 |
| 4,418,391 | 11/1983 | Asada et al. | 371/20 |
| 4,453,517 | 6/1984 | Kasiewicz | 364/424 |
| 4,489,414 | 12/1984 | Titherley | 371/15 |

Primary Examiner—Michael R. Fleming
Attorney, Agent, or Firm—Antonelli, Terry & Wands

[57] ABSTRACT

An electric vehicle driven by a D.C. series motor is disclosed in which electric power is supplied from a battery to the motor through a chopper, and in which forward-motion and backward-motion commands generated by the switch operation of a driver and a torque command from an accelerator pedal are supplied to a control device having a microprocessor, to control the chopper. The control device further includes storage means which has stored therein a trouble shooting program in addition to a program for making an ordinary running control for the electric vehicle, and is provided with a connector jack for connecting a trouble-shooting operation part to the control device. When a starting switch provided in the trouble-shooting operation part is operated in the state that the trouble-shooting operation part is connected to the control device, the control device reads out the trouble shooting program, carries out trouble shooting, and displays the results of trouble shooting on a display device provided in the trouble-shooting operation part.

14 Claims, 11 Drawing Figures

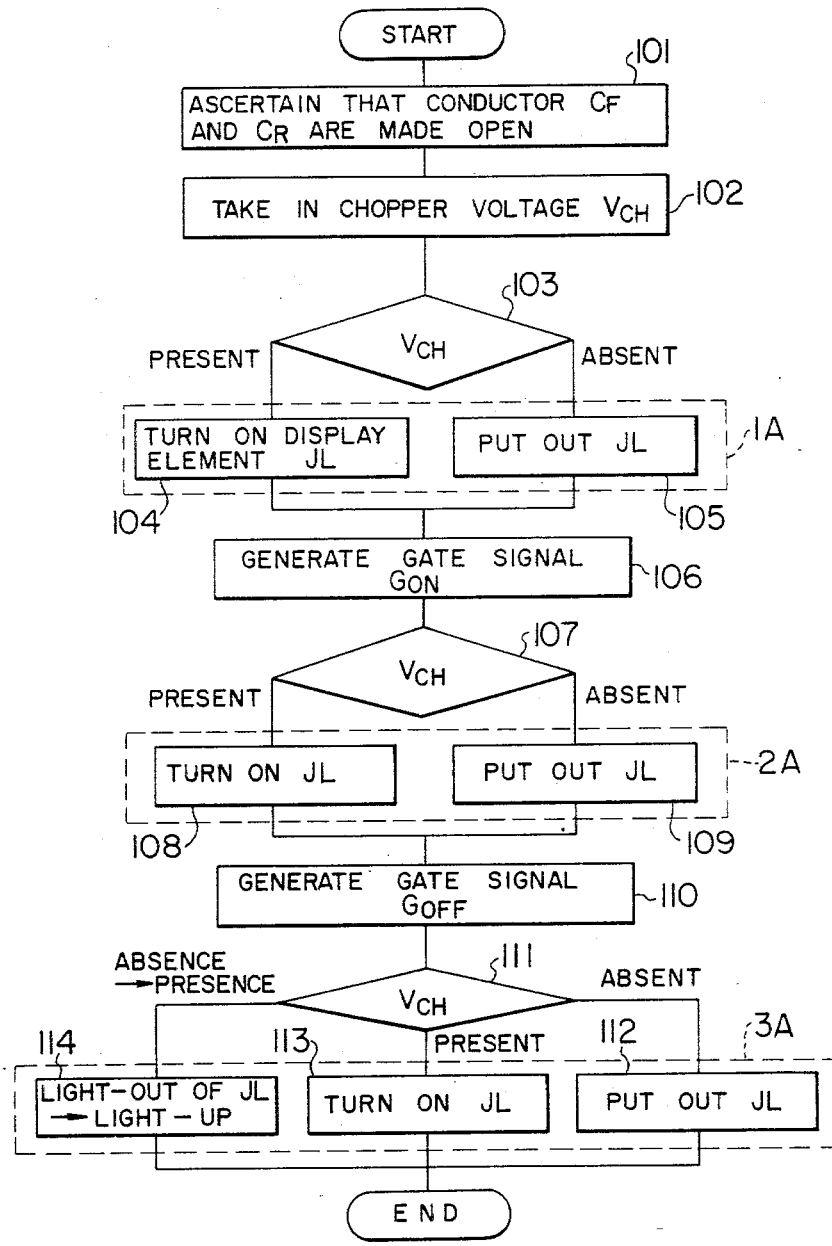

4,564,942

TROUBLE SHOOTING SYSTEM FOR ELECTRIC VEHICLE

BACKGROUND OF THE INVENTION

1. Field of the Invention

The present invention relates to a trouble shooting system for an electric vehicle, for example, a battery forklift truck in which a D.C. motor operating from a battery is controlled by a chopper.

2. Description of the Prior Art

In electromobiles, a typical one of which is a battery forklift truck, a driving D.C. motor is controlled by a chopper in such a manner that all operations of a driver are converted into electric signals which are transmitted to an electric control device for controlling the chopper. In order to detect a fault in the control device, trouble shooting has hitherto been performed manually for various parts thereof. Further, it is desirable to make the trouble shooting automatic. However, it has been difficult to perform trouble shooting for the control device incorporated in an electric vehicle.

SUMMARY OF THE INVENTION

An object of the present invention is to provide a trouble shooting system for an electric vehicle which can perform trouble shooting for a control device incorporated in an electric vehicle without detaching the control device therefrom.

According to an aspect of the present invention, an electric vehicle is provided with storage means for storing therein a control program for effecting ordinary running control for the vehicle and a trouble shooting program for carrying out trouble shooting for various parts of the vehicle, a control part having a microcomputer for reading out a program corresponding to each of various commands from the storage means to perform a control operation in accordance with the read-out program, a driving operation part for supplying a vehicle driving command to the control part, and a trouble shooting operation part for supplying a trouble shooting command to the control part and for displaying the results of trouble shooting.

With such a construction, the electric vehicle can run on the basis of an ordinary driving operation which is performed by a driver in the driving operation part. Further, trouble shooting can be carried out by a trouble-shooting command which is supplied from the trouble-shooting operation part as needed, and the results of the trouble shooting are displayed on the trouble-shooting operation part.

Further, according to another aspect of the present invention, the above-mentioned trouble-shooting operation part can be mounted on the electric vehicle detachably.

The above and other objects, features and advantages of the present invention will become more apparent from the following detailed description of an embodiment thereof.

BRIEF DESCRIPTION OF THE DRAWINGS

FIG. 8 is a flow chart for explaining a trouble-shooting procedure for the chopper shown in FIG. 7.

DESCRIPTION OF THE PREFERRED EMBODIMENT

Now, a preferred embodiment of the present invention will be explained below, with reference to the drawings.

Figure 1:
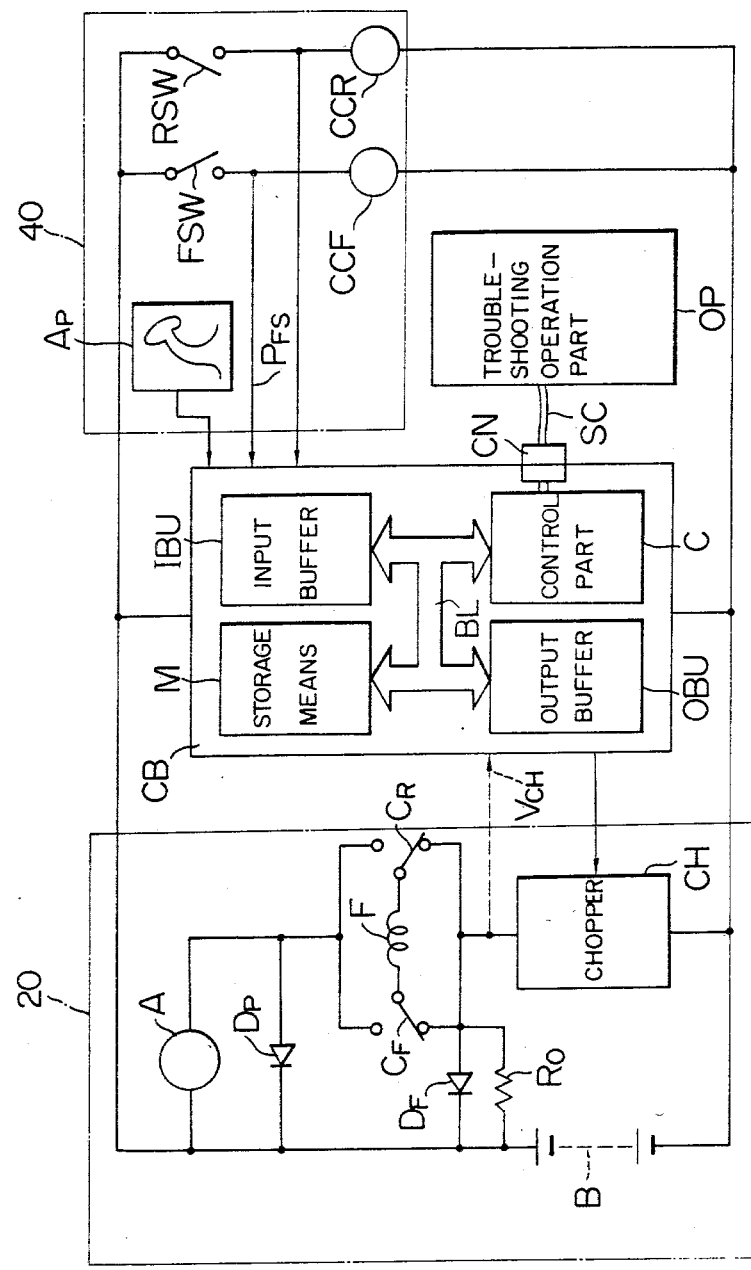
FIG. 1 is a block diagram showing a trouble shooting system according to the present invention which is applied to a battery forklift truck.

FIG. 1 shows, in block, a trouble shooting system according to the present invention which is applied to a battery forklift truck. Referring to FIG. 1, a driving part 20 of a battery forklift truck includes a battery B, an armature A of motor, a plugging diode $D_P$, a contactor $C_F$ for forward motion, a contactor $C_R$ for backward motion, a field coil F of the motor, a flywheel diode $D_F$, a resistor $R_O$, and a chopper CH for controlling the motor current. Each of the contactor $C_F$ for forward motion, contactor $C_R$ for backward motion and chopper CH is controlled by a control signal from a control device CB, to control the running of the forklift truck. That is, when the contactor $C_F$ for forward motion is set by a control signal from the control device, the forklift truck runs forward. When the contactor $C_R$ for backward motion is set, the forklift truck moves backward. Further, the torque given to the forklift truck is controlled by a current indicating signal supplied to the chopper CH.

These control operations in the driving part 20 are performed on the basis of commands from a driving operation part 40, that is, driver's operations made for the part 40. In more detail, the contactor $C_F$ for forward motion is set when a switch FSW for forward motion is closed by a driver to energize an exciting coil CCF, and the contactor $C_R$ for backward motion is set when a switch RSW for backward motion is closed by the driver to energize an exciting coil CCR. The chopper CH is operated on the basis of an electric signal which is generated by a signal generator AP and corresponds to how much an accelerator pedal is depressed. In general, the signal generator AP generates the current indicating signal. Since the driving motor of the forklift truck is a D.C. series motor, the torque of the driving motor is proportional to the current supplied thereto. Accordingly, when the driving motor is supplied with a current proportional to the degree in which an accelerator pedal is depressed, the same driving sensation as in an ordinary automobile can be obtained in the forklift truck. Alternatively, the signal generator AP may be modified so as to generate an electric signal corresponding to a desired speed, and thus the voltage applied to the D.C. series motor is controlled so as to correspond to the electric signal. In this case, a constant speed control system is constructed.

In order to control the driving part 20 on the basis of the commands from the driving operation part 40, the control device CB is basically formed of a microcomputer. That is, the control device CB includes an input buffer IBU for taking in the commands from the driving operation part 40, an output buffer OBU for outputting a control signal, storage means M (for example, a read only memory) for storing therein a control program for controlling the running state of an electric vehicle and a trouble-shooting program for effecting trouble shooting for various parts of the electric vehicle, and a control part C (that is, a microprocessor) receiving a command for reading out a program corresponding to the command from the storage means M to perform various arithmetic and logic operations in accordance with the read-out program. The input buffer IBU, output buffer OBU, storage means M and control part C are connected to one another by means of a bus line BL.

The control part C takes in the control program from the storage means M, to perform arithmetic and logic operations in accordance with the control program and to generate the control signal for controlling the driving part 20. Further, the control part C reads out the trouble-shooting program from the storage means M in response to a command from the trouble-shooting operation part OP, which instructs the control part C to carry out trouble shooting and informs the outside of the results of the trouble shooting, to carry out trouble shooting in accordance with the read-out program and to send the results of the trouble shooting to the trouble-shooting operation part OP.

The trouble-shooting operation part OP is connected to the control device CB by means of a signal line SC having a connector CN. The trouble-shooting operation part OP and control device CB are detachably connected to each other by the connector CN.

Figure 2:
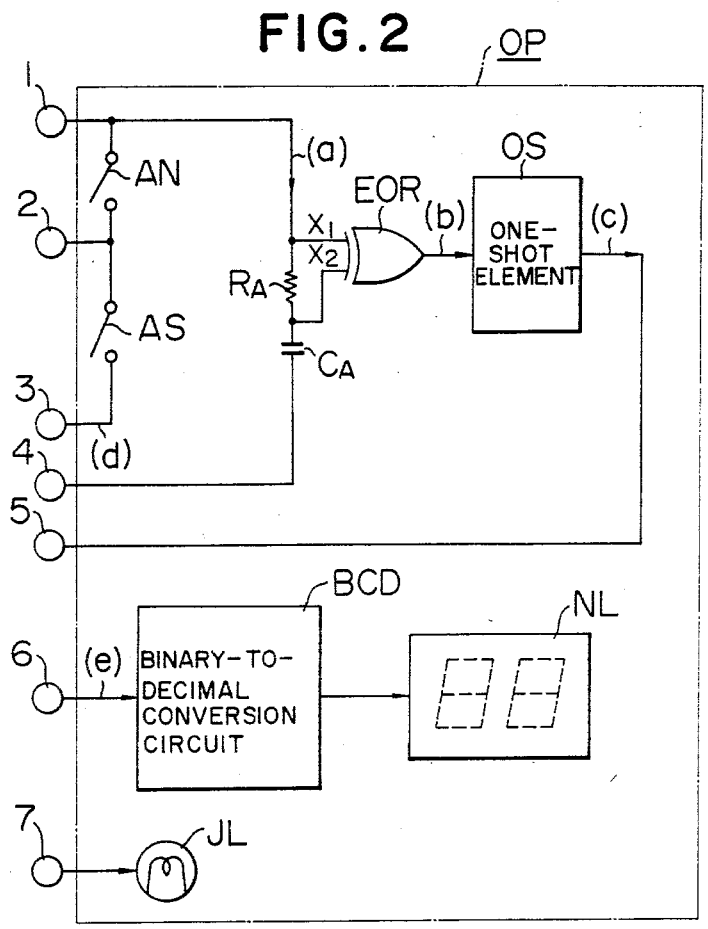
FIG. 2 is a circuit diagram showing the circuit configuration of the trouble-shooting operation part shown in FIG. 1.

As shown in FIG. 2, the trouble-shooting operation part OP includes a starting switch AN for instructing the control part C to carry out trouble shooting, a selection switch AS for selecting one of trouble-shooting items, a resistor $R_A$, a capacitor $C_A$, an exclusive-OR element EOR, a one-shot element OS, a binary-to-decimal conversion circuit BCD, a display element NL for displaying a trouble-shooting item, and a judgment display element (for example, a lamp) JL. Terminals 1 to 7 shown in FIG. 2 are connected to the control device CB through the connector CN and signal line SC. Incidentally, the terminal 2 is connected to receive a supply voltage for the control device CB, and the terminal 4 is grounded.

Figure 3:
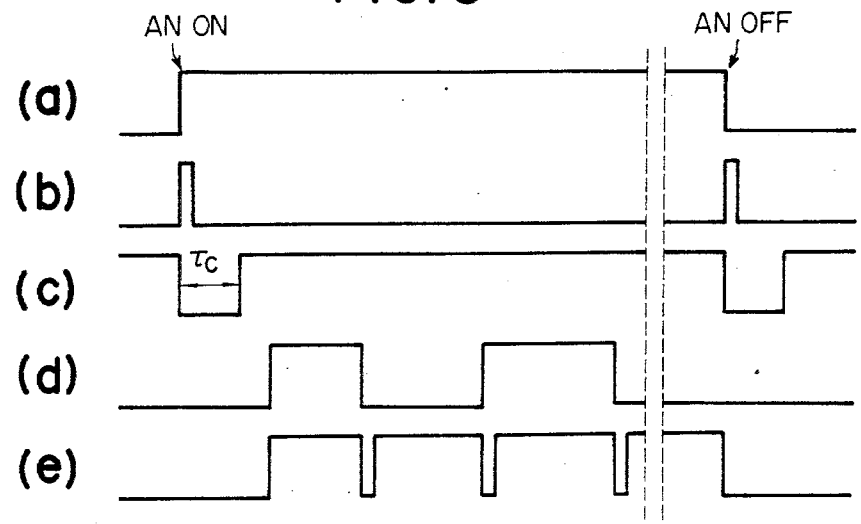
FIGS. 3a–e are waveform charts for explaining the operations of various circuit elements shown in FIG. 2.
Figure 4:
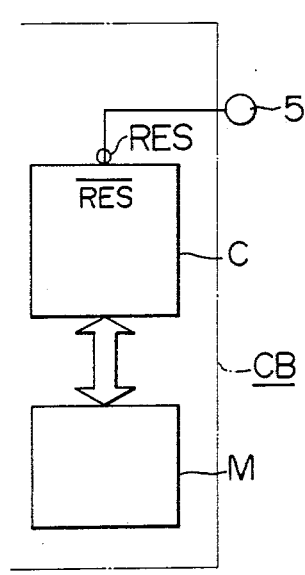
FIG. 4 is a schematic view showing the electrical connection between the control device and trouble-shooting operation part shown in FIG. 1.
Figure 5:
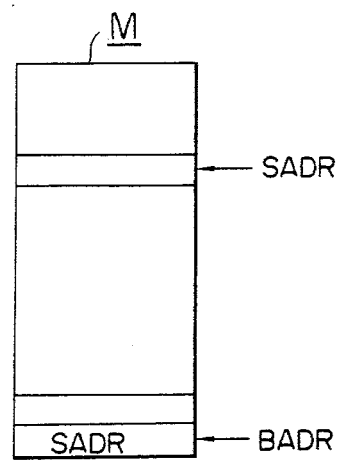
FIG. 5 is a schematic view for explaining the contents of addresses at the storage means shown in FIG. 1.
Figure 6:
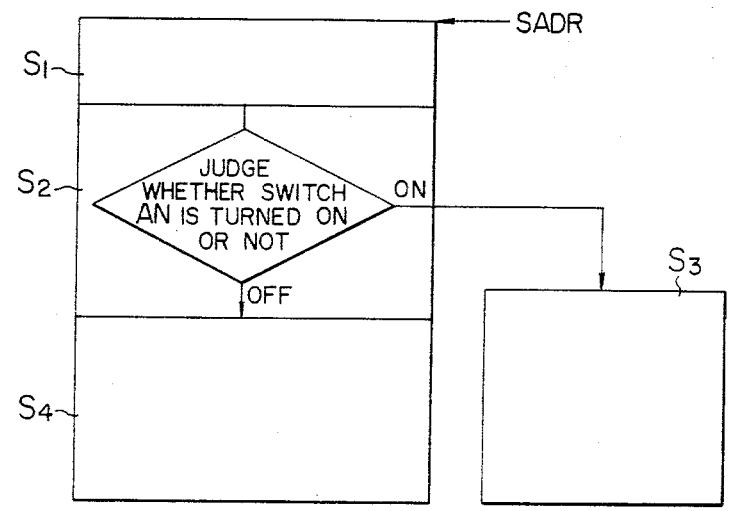
FIG. 6 is a schematic view of explaining the processing performed by the control device.

In the case where trouble shooting is carried out by the use of the trouble-shooting operation part OP having the above-mentioned circuit configuration, the starting switch AN is operated with an ON-OFF action. Then, a signal a shown in FIG. 3 charges the capacitor $C_A$ via the resistor $R_A$, and thus when input voltages $X_1$ and $X_2$ to an exclusive-OR element EOR are not equal, the EOR produces an output signal b shown in FIG. 3, which is applied to the one-shot element OS. When receiving the signal b (namely, a pulse), the one-shot element OS generates a signal c shown in FIG. 3, that is, a signal having a level of zero for a fixed time $\tau_c$. The signal c is sent to the control device CB through the terminal 5. As shown in FIG. 4, the terminal 5 is connected to a reset terminal RES of the control part C. When the signal level at the reset terminal RES is made zero, the control part C refers to a vector address BADR storing a start address SADR of an address map. An area of the storage part M is allotted for the vector address BADR as shown in FIG. 5. When the signal applied to the reset terminal RES has a level of "1" after the time $\tau_c$ has elapsed, logical processing from the start address is carried out. Referring to FIG. 6 which shows the above-mentioned processing in blocks, initialization is made in a processing block S1 in accordance with the start address SADR, and subsequently it is judged in a processing block S2 whether the starting switch AN is turned on or not. In the case where the starting switch AN is turned on, it is judged that the starting switch AN is kept at the ON-state, since a signal from the terminal 1 is applied to the control device CB. Thus, the processing in a processing block S3 is performed. In the processing block S3, processing according to the trouble-shooting program stored in the storage means M is carried out.

The trouble-shooting program contains programs corresponding to various trouble-shooting items, and therefore it is necessary to take a program corresponding to a desired trouble-shooting item out of the trouble-shooting program. The desired trouble-shooting item is selected by operating the selection switch AS. For instance, when the selection switch AS is operated two times of ON-OFF action, a signal d shown in FIG. 3 is applied to the control device CB in accordance with the ON-OFF action of the selection switch AS. A signal e synchronized with the rising and falling edges of the signal d is applied to the binary-to-decimal conversion circuit BCD through the terminal 6, and thus the number of the trouble-shooting item corresponding to the ON-OFF action of the selection switch AS is displayed on the trouble-shooting item display element NL.

When a trouble-shooting item is selected in accordance with the ON-OFF action of the selection switch AS as mentioned above, a program corresponding to the selected item is executed, and the results of trouble-shooting are sent to the judgment display element JL through the terminal 7 to turn on or put out the display element JL in accordance with the results of trouble-shooting.

Next, explanation will be made on a trouble-shooting procedure for the chopper CH shown in FIG. 1.

Figure 7:
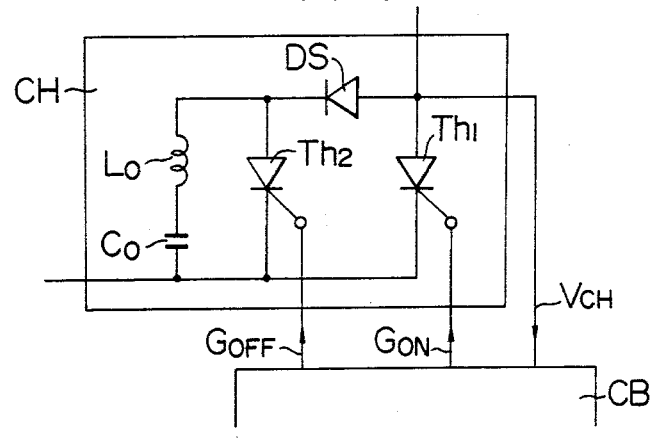
FIG. 7 is a circuit diagram showing the circuit configuration of the chopper shown in FIG. 1.

As shown in FIG. 7, the chopper CH is made up of thyristors $Th_1$ and $Th_2$, a diode $D_S$, a capacitor $C_o$, and a reactor $L_o$. The thyristors $Th_1$ and $Th_2$ become defective more readily than the remaining circuit elements of the chopper CH. Accordingly, the trouble-shooting for the thyristors will be explained below. In the present embodiment, a supply voltage is applied to the chopper CH through the resistor $R_o$ as shown in FIG. 1, and therefore trouble-shooting can be made for the chopper CH even when the driving motor does not run.

The trouble-shooting for the thyristors $Th_1$ and $Th_2$ is performed in accordance with the procedure shown in FIG. 8. After having operated the selection switch AS, it is ascertained in step 101 that each of the contactors $C_F$ and $C_R$ is set to the OFF-side, that is, is kept at the state shown in FIG. 1. Subsequently, the control part takes in the chopper voltage $V_{CH}$ in step 102 as shown in FIG. 7, to judge in step 103 whether the chopper voltage $V_{CH}$ is present or not. When it is judged that the chopper voltage is present, the judgment display element JL is turned on in step 104. On the other hand, when it is judged that the chopper voltage $V_{CH}$ is absent, the judgment display element JL is kept at the light-out state in step 105. The results of trouble shooting in the above case are summarized in a trouble-shooting item 1A of the following Table 1.

TABLE 1

| Item | Display Element JL | Results of Trouble Shooting |
|---|---|---|
| 1A | light-up | Both of thyristors $Th_1$ and $Th_2$ are normal. |
|  | light-out | Thyristor $Th_1$ or $Th_2$ is defective in conduction. |
| 2A | light-out | Thyristor $Th_1$ is normal. |
|  | light-up | Thyristor $Th_1$ or gate signal $S_{on}$ is abnormal. |
| 3A | light-out → light-up | Thyristor $Th_2$ is normal. |
|  | light-up | Thyristor $Th_2$ or gate signal $S_{off}$ is abnormal. |
|  | light-out | Thyristor $Th_2$ or gate signal $S_{off}$ is abnormal. |

Subsequently, the processing for the next trouble-shooting item is carried out by operating the selection switch AS. That is, a gate signal $G_{on}$ for turning on the thyristor $Th_1$ is applied to the thyristor $Th_1$ in step 106. It is judged in this state whether the chopper voltage $V_{CH}$ is present or not (step 107). When it is judged that the chopper voltage $V_{CH}$ is present, the judgment display element JL is turned on in step 108. On the other hand, when it is judged that the chopper voltage $V_{CH}$ is absent, the judgment display element JL is put out in step 109. The results of trouble-shooting in this case are summarized in a trouble-shooting item 2A of the Table 1.

Next, the processing for a further trouble-shooting item is carried out by operating the selection switch AS. That is, a gate signal $G_{off}$ for turning off the thyristor $Th_2$ is applied to the thyristor $Th_2$ in step 110. Immediately after the gate signal $G_{off}$ is applied to the thyristor $Th_2$, it is judged whether the chopper voltage $V_{CH}$ is present or not (step 111). Further, in step 111, it is judged whether the state having no chopper voltage is changed to the state having the chopper voltage $V_{CH}$, or not. When it is judged that the absence of the chopper voltage CH is maintained, the judgment display element JL is put out in step 112. When it is judged that the presence of the chopper voltage $V_{CH}$ is maintained, the judgment display element JL is turned on in step 113. Further, when the state having no chopper voltage is changed to the state having the chopper voltage $V_{CH}$, the processing in step 114 is performed, that is, the judgment display element JL is changed from the light-out state into the light-up state. The results of trouble shooting in this case are summarized in a trouble-shooting item 3A of the Table 1.

Figure 9:
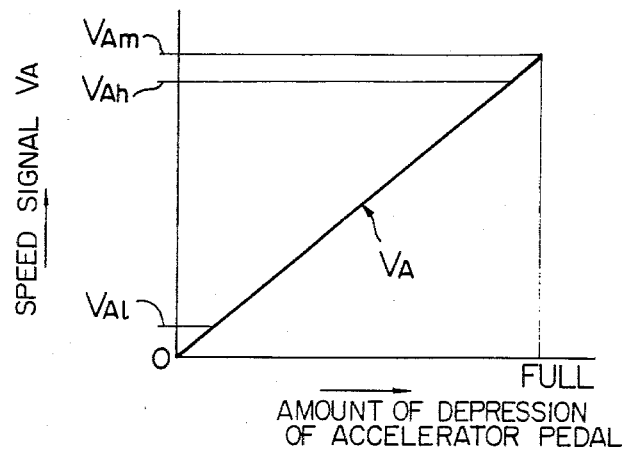
FIG. 9 is a graph showing a relation between the degree in which an accelerator pedal is depressed and a speed signal generated by the speed signal generator shown in FIG. 1.
Figure 10:
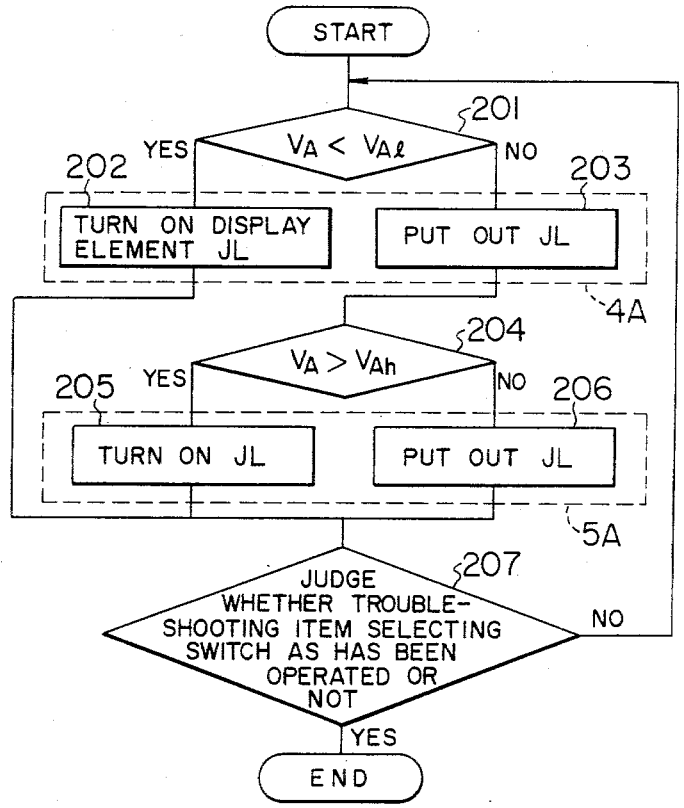
FIG. 10 is a flow chart for explaining a trouble-shooting procedure for the speed signal generator shown in FIG. 1.

Next, explanation will be made on the processing for the accelerator pedal depressing action in the driving operation part 40. The signal generator AP generates a signal $V_A$ whose level corresponds to how much the accelerator pedal is depressed. As shown in FIG. 9 the signal $V_{Al}$ is normally at a lower level of $0 \sim V_{Al}$ when the accelerator pedal is not depressed and at a higher level of $V_{Ah}$ to $V_{Am}$ when the accelerator pedal is fully depressed. Thus, it is required for the signal $V_A$ to be less than $V_{Al}$ when the pedal is not depressed and to be higher than $V_{Ah}$ when the pedal is fully depressed. Accordingly, the trouble-shooting for the signal generator AP can be made by judging whether the level of the signal $V_A$ is higher than the values $V_{Al}$ and $V_{Ah}$ or not, while depressing the accelerator pedal until fully depressed. This processing is carried out in accordance with the flow chart shown in FIG. 10. That is, it is judged in step 201 whether the signal $V_A$ from the signal generator AP has a level lower than the value $V_{Al}$ or not. When the result of judgment is "YES", the judgment display element JL is turned on in step 202. When the result of judgment is "NO", the element JL is put out in step 203. When the element JL is kept at the light-out state, the processing in step 204 is carried out, that is, it is judged whether the signal $V_A$ has a level higher than the value $V_{Ah}$ or not. When the result of judgment is "YES", the judgment display element JL is turned on in step 205. When the result of judgment is "NO", the element JL is put out in step 206. When the above-mentioned processing has been performed, it is judged in step 207 whether the selection switch AS has been operated or not. When the result of judgment is "NO", the processing in step 201 is again performed. When the result of judgment is "YES", the trouble shorting for the signal generator AP is completed.

The results of the above-mentioned trouble-shooting for the signal generator are summarized in items 4A and 5A of the following Table 2.

TABLE 2

| Item | How much is accelerator pedal depressed | Display Element JL | Results of trouble shooting |
|---|---|---|---|
| 4A | zero | light-up | Signal generator AP is normal |
|  |  | light-out | Signal generator AP is abnormal |
|  | halfway | light-up | Signal generator AP is normal |
| 5A | maximum | light-up | Signal generator AP is normal |
|  |  | light-out | Signal generator AP is abnormal |

Incidentally, the trouble shooting in the state that the accelerator pedal is depressed halfway, is carried out in both of the items 4A and 5A.

Figure 11:
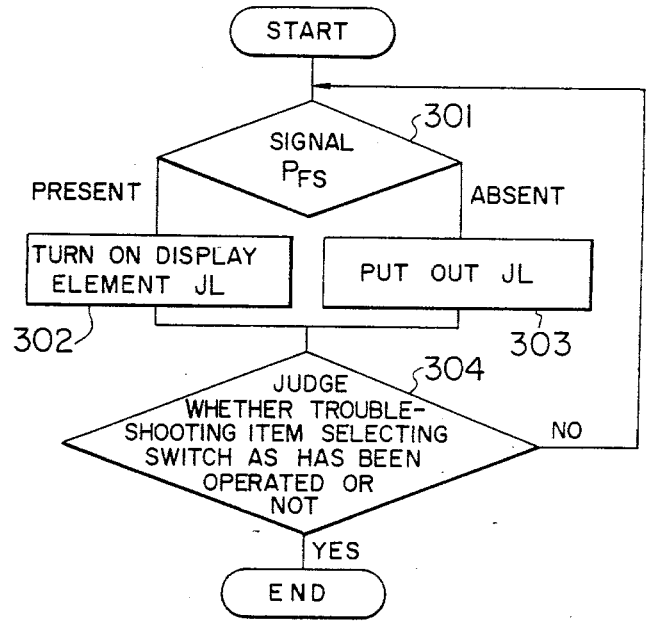
FIG. 11 is a flow chart for explaining a trouble-shooting procedure for the forward-motion switch shown in FIG. 1.

Next explanation will be made on a trouble shooting procedure for a forward motion switch FSW, with reference to FIG. 11. In this case, the ON-OFF action of the forward motion switch FSW in judged on the basis of the presence or absence of a driving signal $P_{FS}$ shown in FIG. 1 (step 301). When the forward motion switch FSW is turned on, the driving signal $P_{FS}$ appears, and the judgment display element JL is turned on in step 302. Thus, it is judged that the switch FSW performs a normal turn-on action. Further, when the forward motion switch FSW is turned off, the signal $P_{FS}$ disappears, and the judgment display element JL is put out in step 303. It is judged by ascertaining the light-out of the element JL that the switch FSW performs a normal turn-off action. After the above-mentioned processing has been completed, it is judged in step 304 whether the selection switch AS has been operated or not. When the result of judgment is "NO", the trouble-shooting processing starting from step 301 is again performed. When the result of judgment is "YES", the trouble-shooting for the forward motion switch FSW is completed.

As mentioned above, in the present embodiment, trouble-shooting processing is performed under each of various trouble-shooting items contained in the trouble-shooting program, and therefore trouble shooting can be made for various parts of the battery forklift truck. Further, in the case where trouble shooting is made for the control device CB itself, the control device CB is caused to perform various processing in accordance with a trouble-shooting program for carrying out trouble shooting for the control device CB. Thus, trouble shooting can be made for the control device CB proper in the same manner as mentioned above.

When the processing with respect to trouble shooting has been completed, the starting switch AN is turned off. Then, the signal supplied to the exclusive-OR element EOR, that is, the signal a shown in FIG. 3 falls to the level of zero. Thus, the pulse b synchronized with this falltime supplied to the one-shot element OS. The signal c having the level of zero for the fixed time $\tau_c$ is supplied from the one-shot element OS to the control device CB through the terminal 5. The control device CB refers to the vector address BADR of the storage part M in the time $\tau_c$. When the signal c again takes the level of "1", the control device CB performs the processing from the start address SADR. In this case, it is judged in the processing block S2 shown in FIG. 6 that the starting switch AN is turned off. Accordingly, an ordinary driving operation is performed in a processing block S4. The processing in the block S4 is to drive the chopper CH shown in FIG. 1, and is performed in accordance with a running control program (namely, a drive control program) stored in the storage means M.

As explained above, in the present embodiment, when the starting switch AN in the trouble-shooting operation part OP is turned on, the processing for trouble shooting is performed in preference to the processing for driving the chopper CH, even if the latter processing is now being performed. In other words, in the case where the control device CB is connected to the trouble-shooting operation part OP, the chopper CH can be controlled if the starting switch AN is turned off, and trouble shooting can be made immediately each time the starting switch AN is turned on at need.

Further, since the trouble-shooting operation part OP can be detachably connected to the control device CB, the operation part OP for instructing the control device CB to carry out trouble shooting is not required to be always mounted on the forklift truck, but may be mounted thereon only when trouble shooting has to be made for the forklift truck.

Further, the control device used in the present embodiment has a function of controlling the ordinary running state of an electric vehicle and another function of making trouble shooting for various parts of the electric vehicle. Accordingly, trouble shooting can be made in the state that the control device is mounted on the forklift truck. Further, when the forklift truck is provided with the trouble-shooting operation part in addition to the control device, trouble shooting for the forklift truck can be carried out. Since the trouble-shooting operation part is very small in size and light in weight, it is convenient for carrying.

Further, in the present embodiment, the storage means M stores therein the running control program (namely, the drive control program) and the trouble-shooting program, and these programs are executed in the control part C. That is, means for driving the forklift truck and means for carrying out trouble shooting can use some parts in common. As a result, the signal lines for connecting the trouble-shooting operation part and control device can be simplified, and thus the reliability of the trouble shooting system can be improved.

As has been explained in the foregoing description, according to the present invention, the trouble shooting for an electric vehicle can be carried out in the state that a control device for controlling the electric vehicle is mounted thereon.

I claim:

1. A trouble shooting system for an electric vehicle, said electric vehicle being provided with a driving part, a driving operation part and a control device, said driving part including a power source, an electric motor and means for controlling electric power supplied from said power source to said electric motor in response to said driving operation part for driving said electric vehicle, and said control device including a microprocessor connected to receive a command from said driving operation part for supplying a control signal to said driving part and storage means for storing therein a drive control program to be executed by said microprocessor for generating said control signal, said trouble shooting system comprising:

storage means provided in said control device for storing therein a plurality of trouble shooting programs to be executed by said microprocessor for effecting trouble shooting for various parts of said electric vehicle; and a trouble-shooting operation part releasably coupled to said control device and including command generating means responsive to manual operation for generating and supplying a command to said microprocessor in said control device to cause said microprocessor to read out and execute a selected one of said trouble shooting programs and means responsive to said microprocessor for displaying the identification of a trouble-shooting program which is being processed.

2. A trouble shooting system for an electric vehicle, said electric vehicle being provided with a driving part, a driving operation part and a control device, said driving part including a power source, an electric motor and means for controlling electric power supplied from said power source to said electric motor in response to said driving operation part for driving said electric vehicle, and said control device including a microprocessor connected to receive a command from said driving operation part for supplying a control signal to said driving part and storage means for storing therein a drive control program to be executed by said microprocessor for generating said control signal, said trouble shooting system comprising:

storage means provided in said control device for storing therein a plurality of trouble shooting programs to be executed by said microprocessor for effecting trouble shooting for various parts of said electric vehicle; and a trouble-shooting operation part releasably coupled to said control device and including command generating means responsive to manual operation for generating and supplying a command to said microprocessor in said control device to cause said microprocessor to read out and execute a selected one of said trouble shooting programs, said command generating means including a selection switch for selecting a trouble-shooting program.

3. A trouble-shooting system for an electric vehicle, said electric vehicle being provided with a driving part, a driving operation part and a control device, said driving part including a power source, an electric motor and means for controlling electric power supplied from said power source to said electric motor in response to said driving operation part for driving said electric vehicle, and said control device including a microprocessor connected to receive a command from said driving operation part for supplying a control signal to said driving part and storage means for storing therein a drive control program to be executed by said microprocessor for generating said control signal, said trouble shooting system comprising:

storage means provided in said control device for storing therein a plurality of trouble shooting programs to be executed by said microprocessor for effecting trouble shooting for various parts of said electric vehicle; and a trouble-shooting operation part releasably coupled to said control device and including command generating means responsive to manual operation for generating and supplying a command to said microprocessor in said control device to cause said microprocessor to read out and execute a selected one of said trouble shooting programs;

wherein said driving operation part includes a switch for forward motion, a switch for backward motion and an accelerator pedal, and wherein said control device includes means responsive to a selected trouble-shooting program for judging whether a respective electric signal generated by operating said switch for forward motion, said switch for backward motion and said accelerator pedal is normal or not.

4. A trouble-shooting system for an electric vehicle, said electric vehicle being provided with a driving part, a driving operation part and a control device, said driving part including a power source, an electric motor and means for controlling electric power supplied from said power source to said electric motor in response to said driving operation part for driving said electric vehicle, and said control device including a microprocessor connected to receive a command from said driving operation part for supplying a control signal to said driving part and storage means for storing therein a drive control program to be executed by said microprocessor for generating said control signal, said trouble shooting system comprising:

storage means provided in said control device for storing therein a plurality of trouble shooting programs to be executed by said microprocessor for effecting trouble shooting for various parts of said electric vehicle; and a trouble-shooting operation part releasably coupled to said control device and including command generating means responsive to manual operation for generating and supplying a command to said microprocessor in said control device to cause said microprocessor to read out and execute a selected one of said trouble shooting programs;

wherein said control device includes means for judging whether said command for reading out and executing said trouble shooting program is present or not and for executing said trouble shooting program or said drive control program according to whether said command is present or absent.

5. A trouble shooting system for an electric vehicle, said electric vehicle including (1) a driving unit having a power source, an electric motor, and means for controlling electric power supplied to said motor from said power source;

(2) a driving control unit having means for producing a driving command signal for controlling ordinary driving operation of the electric vehicle;

(3) a control processing unit connected to said driving unit and said driving control unit and having a microprocessor which produces a control signal supplied to said means for controlling electric power of said driving unit in response to the driving command signal from said command signal producing means; and (4) memory means connected to said microprocessor for storing a control program for the ordinary driving operation of the electric vehicle, said microprocessor producing said control signal on the basis of execution of said control program;

wherein said memory means in said electric vehicle further stores a trouble shooting program for effecting trouble shooting operations of various parts of said electric vehicle, and said trouble shooting system including a trouble shooting operation unit having (5) detachable connection means removably connected to said control processing unit to transmit a trouble shooting command and a trouble shooting result signal between said control processing unit and said trouble shooting operation unit;

(6) operation means for generating said trouble shooting command in response to manual operation, said microprocessor including means for reading out said trouble shooting program from said memory means in response to said trouble shooting command thereby to execute a trouble shooting operation and produce a trouble shooting result signal; and (7) display means for displaying an identification of said trouble shooting operation under process.

6. A trouble shooting system for an electric vehicle according to claim 5, wherein said operation means includes a selection switch for selecting a trouble-shooting operation of said trouble shooting program.

7. A trouble shooting system for an electric vehicle according to claim 5, wherein said driving control unit includes a switch for forward motion, a switch for backward motion and an accelerator pedal, and wherein said control processing unit includes means responsive to said trouble shooting program for producing a trouble shooting result signal indicating whether a respective electric signal generated by operating said switch for forward motion, said switch for backward motion and said accelerator pedal is normal or not.

8. A trouble shooting system for an electric vehicle according to claim 5, wherein said control processing unit includes means for judging whether said command for reading out and executing said trouble shooting program is present or not and for executing said trouble shooting program or said drive control program according to whether said command is present or absent.

9. A trouble shooting system for an electric vehicle, said electric vehicle including (1) a driving unit having a power source, an electric motor, and means for controlling electric power supplied to said motor from said power source;

(2) a driving control unit having means for producing a driving command signal for controlling ordinary driving operation of the electric vehicle;

(3) a control processing unit connected to said driving unit and said driving control unit and having a microprocessor which produces a control signal supplied to said means for controlling electric power of said driving unit in response to the driving command signal from said command signal producing means; and (4) memory means connected to said microprocessor for storing a control program for the ordinary driving operation of the electric vehicle, said microprocessor producing said control signal on the basis of execution of said control program;

wherein
said memory means in said electric vehicle further stores a trouble shooting program for effecting trouble shooting operations of various parts of said electric vehicle, and said trouble shooting system including a trouble shooting operation unit having (5) detachable connection means removably connected to said control processing unit to transmit a trouble shooting command and a trouble shooting result between said control processing unit and said trouble shooting operation unit;

(6) operation means for generating said trouble shooting command in response to manual operation, said microprocessor including means for reading out said trouble shooting program from said memory means in response to said trouble shooting command thereby to execute a trouble shooting operation; and (7) display means for displaying an indication of the trouble shooting result as received from said microprocessor.

10. A trouble shooting system for an electric vehicle according to claim 9, wherein said drive control program and said trouble shooting program are stored in different areas of a single memory device.

11. A trouble shooting system for an electric vehicle according to claim 9, wherein said operation means includes means for displaying a trouble-shooting operation under process.

12. A trouble shooting system for an electric vehicle according to claim 9, wherein said operation means includes a selection switch for selecting a trouble-shooting operation of said trouble shooting program.

13. A trouble shooting system for an electric vehicle according to claim 9, wherein said driving control unit includes a switch for forward motion, a switch for backward motion and an accelerator pedal, and wherein said control processing unit includes means responsive to said trouble shooting program for judging whether the respective electric signals generated by operating said switch for forward motion, said switch for backward motion and said accelerator pedal are normal or not.

14. A trouble shooting system for an electric vehicle according to claim 9, wherein said control processing unit includes means for judging whether said command for reading out and executing said trouble shooting program is present or not and for executing said trouble shooting program or said drive control program according to whether said command is present or absent.

* * * * *